United States Patent

Inoue et al.

Patent Number: 5,759,457
Date of Patent: Jun. 2, 1998

[54] METHOD FOR MANUFACTURING AN OPTICAL ELEMENT

[75] Inventors: Kenji Inoue, Hyogo; Makoto Umetani, Osaka; Hidenao Kataoka, Osaka; Yoshiyuki Shimizu, Osaka, all of Japan

[73] Assignee: Matsushita Electric Industrial Co., Ltd., Osaka, Japan

[21] Appl. No.: 599,026

[22] Filed: Feb. 9, 1996

[30] Foreign Application Priority Data

Feb. 24, 1995 [JP] Japan .................. 7-36827

[51] Int. Cl.[6] .................. B29D 11/00
[52] U.S. Cl. .................. 264/2.5; 216/24; 216/26; 264/1.36; 425/810
[58] Field of Search .................. 264/1.36, 1.37, 264/1.38, 2.5; 425/808, 810; 216/25, 26, 24

[56] References Cited

U.S. PATENT DOCUMENTS

| 5,015,280 | 5/1991 | Kimoto et al. .................. 65/307 |
| 5,338,178 | 8/1994 | Kato et al. |
| 5,348,616 | 9/1994 | Hartman et al. .................. 216/48 |
| 5,389,313 | 2/1995 | Imataki et al. .................. 264/2.5 |

FOREIGN PATENT DOCUMENTS

| 0 356 068 | 2/1990 | European Pat. Off. |
| 0 636 585 | 2/1995 | European Pat. Off. |
| 38 32 907 | 4/1989 | Germany |
| 58-1515 | 1/1983 | Japan |
| 05-107467 | 4/1993 | Japan |

Primary Examiner—Mathieu D. Vargot
Attorney, Agent, or Firm—Merchant, Gould, Smith, Edell, Welter & Schmidt, P.A.

[57] ABSTRACT

An aspherical lens, which is to be used as an objective lens for an optical pickup of an optical disc apparatus, has at least one optical functional surface of the lens formed to be rotationally asymmetric so as to generate astigmatism of axial wavefront aberration for cancelling off-axis astigmatism. The lens is manufactured by press molding an optical material such as glass or resin. At least one of the dies is formed by etching a rotationally symmetric surface of a base material, unevenly. Thereby, the etched surface becomes rotationally asymmetrically aspherical in shape.

43 Claims, 13 Drawing Sheets

METHOD FOR MANUFACTURING AN OPTICAL ELEMENT

FIELD OF THE INVENTION

This invention relates to a method for manufacturing an optical element such as an aspherical lens for use in an optical apparatus.

BACKGROUND OF THE INVENTION

Generally, an optical head for an optical disc or photomagnetic disc apparatus is driven in a radial direction of the disc for tracking across a recording surface of the disc. Thus, off-axis region of an objective lens is used for reading and writing data on the recording surface of the disc in most cases. However, the optical performance of the lens in the off-axis region is relatively poor compared to the optical performance in the paraxial region, since the astigmatism in the off-axis region is larger than that in the paraxial region. Furthermore, the light beam from a semiconductor laser, which is used as a light source, is astigmatic. Another lens, for focusing the light reflected by the recording surface of the disc on a photodetector, also has astigmatism. Thus, the optical performance of the optical head for reading and writing the data is further reduced.

For increasing the optical performance of the optical head, an objective lens having at least one rotationally asymmetric optical functional surface is proposed in, for example, the gazette abstract of Unexamined Japanese Patent Application Hei 5-107467. By forming the optical functional surface of the objective lens as rotationally asymmetric, an astigmatic component can be given to the aberration along the optical axis. The direction of the objective lens is adjusted in a manner to cancel the above-mentioned astigmatism due to the semiconductor laser and the second lens by the astigmatism given by the rotationally asymmetric surface. However, it is very difficult to manufacture the rotationally asymmetric lens.

Conventionally, a direct polishing method is well known as a manufacturing method for an optical element, in which an optical material is directly polished. In the direct polishing method, the optical material, such as glass, is rubbed with abrasive by a swinging grindstone. Thus, the surface of the optical material is formed to be flat or spherical. The optical element having a rotationally asymmetric shape cannot be manufactured by the conventional direct polishing method.

Recently, a press molding method for manufacturing optical elements is proposed in, for example, U.S. Pat. No. 5,015,280. The press molding method transfers the shape of a die to a surface of the optical material. Thus, if the die is formed precisely, the optical elements having a desired optical performance can be manufactured easily.

When the optical element to be manufactured has a rotationally symmetric shape such as a rotationally symmetric aspherical Lens, the die can be formed by an ultraprecise computer numerically controlled ("CNC") machine tool. The die is rotated around an optical axis of an optical element to be manufactured. A grinding or cutting tool is fed along an aspherical path corresponding to a cross-sectional shape of the optical element. Thus, the die can be manufactured relatively easily by the ultraprecise machine tool, and the form tolerance of the die is within about 0.1 μm.

However, when the optical element to be manufactured has a rotationally asymmetric optical functional surface, the machine tool for forming the die becomes very complex, highly-accurate and expensive. In the machine tool, an encoder is provided on a main spindle of the machine tool for detecting the rotation angle of the die or spindle, and the position of the cutting tool is controlled with high-accuracy by repeating forward and back movement with monitoring of the rotation angle while the die or spindle turns. Furthermore, the tolerance of the die formed by this process is not sufficiently small. Since the main spindle is rotated very slowly so that the position control of the tool can follow the rotation of the die or spindle, the time for working the die becomes long.

Alternatively, the gazette abstract of Unexamined Japanese Patent Application Hei 5-107467 discloses a method for generating astigmatism by controlling the condition for forming the optical element while using a rotationally symmetric die. In this method, the molding temperature, the temperature gradient, the molding pressure, and the shape of the base material to be molded must be controlled precisely. Furthermore, it is difficult to maintain the percent yield in the manufacture of the optical element at a high level. However, the direction of the astigmatism of the optical element is not constant.

As mentioned above, it is very difficult to manufacture the optical element having the rotationally asymmetric shape by the conventional methods.

SUMMARY OF THE INVENTION

The purpose of this invention is to provide a method for easily manufacturing an optical element having at least one rotationally asymmetric optical functional surface.

A method for manufacturing an optical element of this invention comprises the steps of disposing an optical material between a pair of dies, heating the optical material and the dies to a predetermined temperature and pressing the dies for transferring the shapes of the dies onto the surfaces of the optical material, wherein at least one of the surfaces of the die has a rotationally asymmetric shape, and the rotationally asymmetric shape is formed by unevenly etching a rotationally symmetric surface of a base material for the die. In this method, it is preferable that the rotationally asymmetric shape of the die is formed by a dry etching process that has steps of disposing a mask on or above the rotationally symmetric surface of the base material and irradiating ion beams or radical beams onto the rotationally symmetric surface of the base material through the mask. Alternatively, it is preferable that the rotationally asymmetric shape of the die is formed by a wet etching process that has steps of forming a resist film on at least the rotationally symmetric surface of the base material except a predetermined shaped portion to be etched, and steeping at least the rotationally symmetric surface of the base material in an etchant.

Another method for manufacturing an optical element of this invention comprises the steps of disposing an optical material between a pair of dies, heating the optical material and the dies to a predetermined temperature and pressing the dies for transferring the shapes of the dies onto the surfaces of the optical material, wherein at least one of the surfaces of the die has a rotationally asymmetric shape, and the rotationally asymmetric shape is formed by unevenly accumulating a film on a rotationally symmetric surface of a base material for the die. In this method, it is preferable that the rotationally asymmetric shape of the die is formed by a method selected from a sputtering method, and PVD (physical vapor deposition) and CVD (chemical vapor deposition) methods, which has steps of disposing a mask on or above the rotationally symmetric surface of the base material and irradiating particles onto the rotationally symmetric surface of the base material.

Furthermore, in the above-mentioned methods, it is preferable that the rotationally asymmetric shape of the die is toric or cylindrical. Furthermore, it is preferable that the rotationally asymmetric shape of the die is configured in a manner to give astigmatism on axial wavefront aberration when the rotationally asymmetric shape is transferred to the optical element.

By the above-mentioned method for manufacturing an optical element of this invention, the rotationally asymmetric shape of the die is formed by the etching process or the deposition process, so that the die can be made easily. The optical elements such as aspherical lenses are manufactured by press molding of the objective material disposed between the dies, so that the rotationally asymmetric shape of the die is transferred to the surface of the optical element.

The base material having the rotationally symmetric shape on the surface thereof can be formed easily by the conventional cutting or grinding method. In the etching process or deposition process, the etching rate or the deposition rate is stable, so that the quantity of the etching or the deposition can be controlled easily. Thus, the rotationally asymmetric shape of the die can be formed precisely without damaging the original rotationally symmetric shape of the base material. Therefore, no specialized and expensive machine tool is necessary. Especially, the toric shape or the cylindrical shape, which is difficult to form by the conventional method, can be formed on the surface of the die. Furthermore, by the etching process or the deposition process, many dies can be formed at the same time. Thus, the processing time per die can be shortened and the cost per die can be decreased. In the method for etching or depositing on the surface of the base material through the mask, the optical functional surface of the base material can be formed in a desired shape by adjusting the shape of the opening of the mask and/or the position of the mask against the optical functional surface of the base material. Furthermore, the deposition method can be applied in the conventional process for forming a protection film or a mold releasing film on the surface of the die, so that the number of steps for forming the die does not increase.

The optical element such as the aspherical lens manufactured by the above-mentioned methods has at least one rotationally asymmetric optical functional surface, so that it can produce an astigmatic component in the axial wavefront aberration. Thus, optical elements which generate substantially the same amount of astigmatism in substantially the same direction can be manufactured. By detecting the direction of the astigmatism given by the rotationally asymmetric optical functional surface of the optical elements and marking the direction on the optical elements, the optical element can be mounted easily on an optical apparatus by positioning the mark at a predetermined position. Thus, the adjustment of the direction of the optical element about the optical axis while monitoring the astigmatism can be omitted. Furthermore, if a concave or convex shape corresponds to a mark that is formed at an edge part of the die, the mark can be formed at the edge part of the optical element at the time of manufacturing the optical element. Thus, the detection of the direction of the astigmatism given by the rotationally asymmetric optical functional surface can be omitted.

DETAILED DESCRIPTION OF THE INVENTION

FIRST EMBODIMENT

Figure 12:
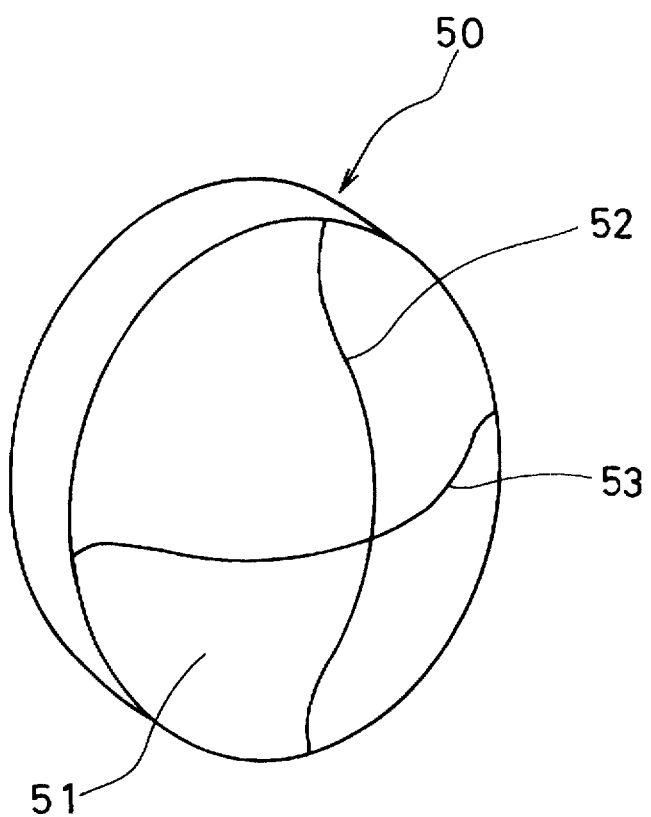
FIG. 12 is a perspective view showing an optical element which is manufactured by the method of this invention.

A first embodiment of a method for manufacturing an optical element of this invention is described referring to FIGS. 1 to 5, and 12 to 13. An optical element 50 such as an aspherical lens to be manufactured is illustrated in FIG. 12. An optical functional surface 51 of the optical element 50 is rotationally asymmetrically aspherical, having a vertical ridge line 52 and a horizontal ridge line 53. The radius of curvature in the vertical direction is different from that in the horizontal direction. Thus, the ridge lines 52 and 53 respectively focus at two different points. The optical element 50 has astigmatism on the optical axis thereof. The optical element 50 is manufactured by press molding of an optical material between a pair of dies. At least one of the dies has a rotationally asymmetric aspherical surface, by which the shape of the rotationally asymmetric aspherical surface is transferred to a surface or the optical material. Thus, the optical functional surface 51 of the optical element 50 can be formed.

Figure 1:
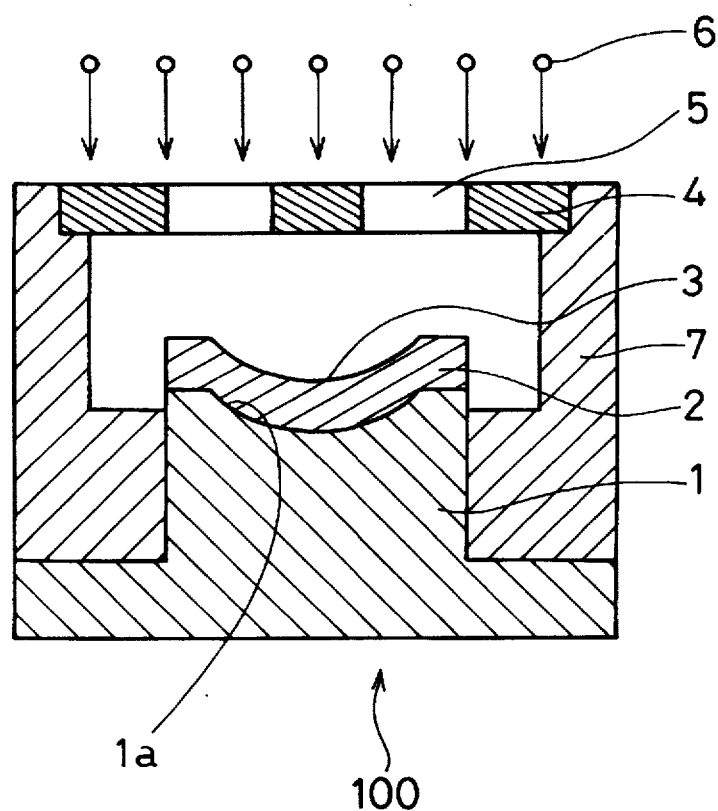
FIG. 1 is a cross-sectional side view showing a configuration of an intermediate assembly and a method for forming a die that are used in a first embodiment of a method for manufacturing an optical element of this invention.

The method for forming the die having a rotationally asymmetric aspherical surface is now described. As shown in FIG. 1, an intermediate assembly 100 is comprised of a base material 1 for a die, a mask 4 and a mask holder 7. The base material 1 is made of a hard metal including tungsten (W) and carbon (C) as main components. An overcoat 2 can preferably be provided on a surface 1a of the base material 1 for preventing the flawing on the surface of the die or adhesion of the melted optical material in the molding process. The mask 4 is disposed a predetermined distance above a surface 3 of the overcoat 2 or the surface 1a of the base material 1 by the mask holder 7. Argon (Ar) ion beams 6 are to be irradiated from above to below the mask 4 for etching the surface 3 of the overcoat 2 or the surface 1a of the base material 1. The die will have the rotationally asymmetric aspherical surface, when the processes for forming the die is completed.

A rotationally symmetric aspherical shape is previously formed on the surface 1a of the base material 1 by the conventional method for forming the conventional rotationally symmetric aspherical surface. The base material 1 was rotated around an axis that corresponds to the optical axis of the optical element to be manufactured. A grinding tool was fed in a manner so that the working point, at which the grinding tool and the base material contact, followed a non-circular arc of a cross-sectional shape of the optical element 50 in a predetermined direction, for example, along the ridge line 52 shown in FIG. 12. The form tolerance of the base material 1 worked by this method was about ±0.1 μm. In case of forming the overcoat 2, such as platinum - iridium (Pt-Ir) alloy film having thickness of 3 μm is formed on the surface 1a of the base material 1 by a sputtering method.

Figure 2:
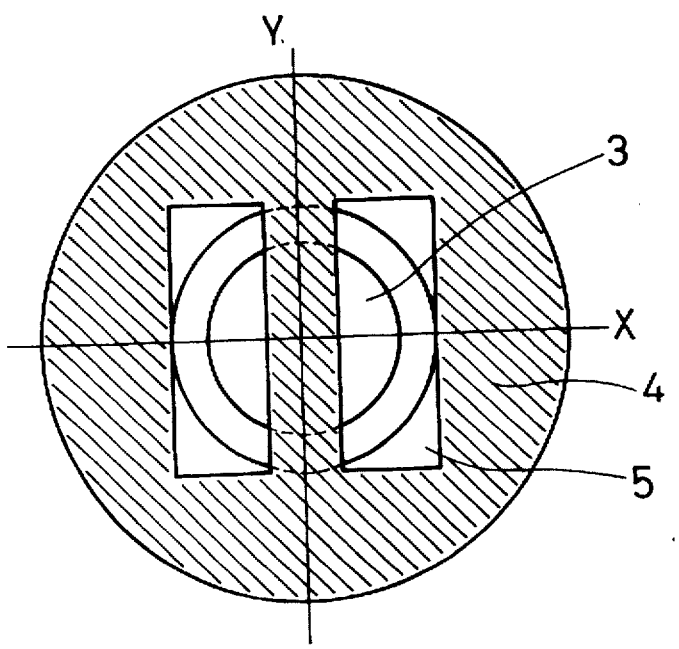
FIG. 2 is a plan view of the intermediate assembly shown in FIG. 1 showing the shapes and the relative positions of a mask and a base material for the die in the first embodiment.

As can be seen from FIG. 2, the crosshatched region of the mask 4 covers the base material 1. For example, the diameter of the molding surface the base material 1 including the edge part was 5 mm, and the diameter of the surface 3 of the overcoat 2 or the surface 1a of the base material 1 was 4 mm. The size of rectangular openings 5 was 5 mm ×2 mm, and the openings 5 were disposed in parallel with a spacing of 1 mm.

Figure 4:
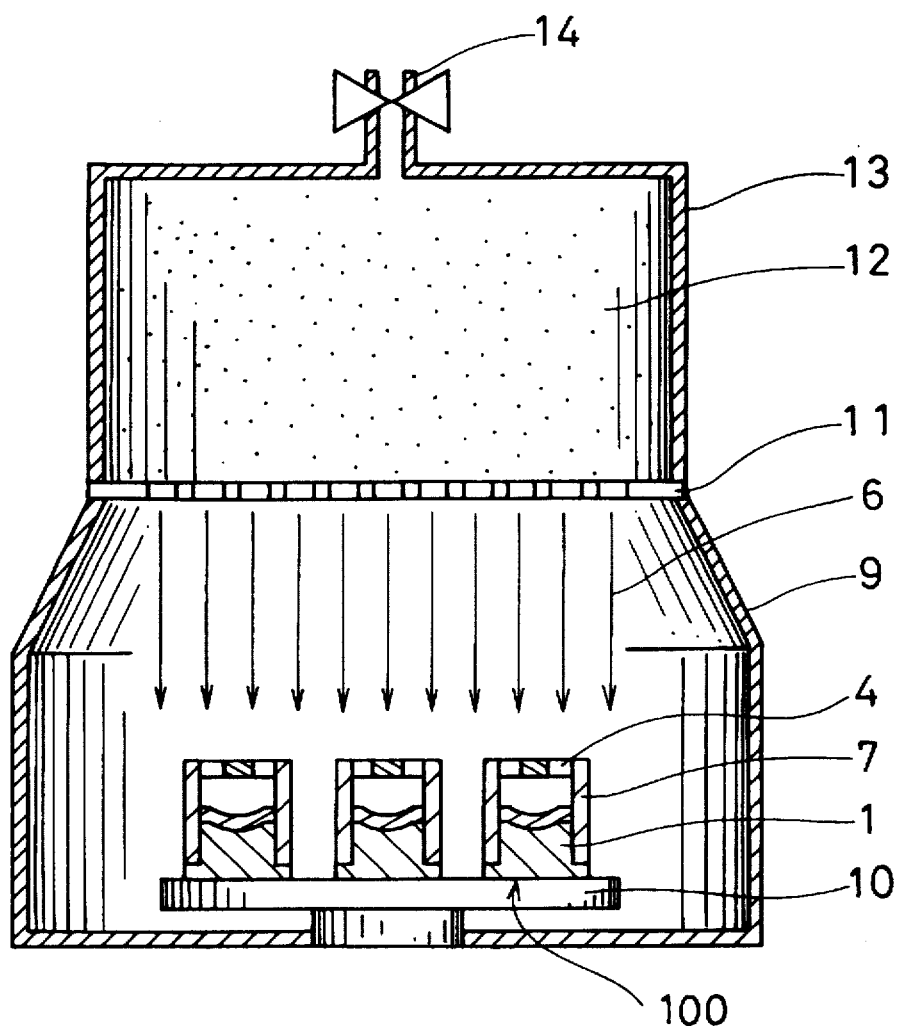
FIG. 4 is a cross-sectional side view showing an etching apparatus used in the first embodiment for forming the die.

Next, the above-mentioned assemblies 100 shown in FIG. 1 are disposed in an etching apparatus shown in FIG. 4. In the first embodiment, the ECR (electron cyclotron resonance) ion beam etching apparatus is used. The etching apparatus is comprised of an etching chamber 9, a stage 10 on which the assemblies 100 are to be mounted, an ion beam accelerating electrode 11 disposed at the top end of the etching chamber 9, and an ion gun 13 disposed above the etching chamber 9.

When the assemblies 100 are mounted on the stage 10, air inside the etching chamber 9 is removed to form a vacuum. After that, argon (Ar) gas is introduced into the ion gun 13 through an argon gas introducing valve 14. The ion gun 13 generates plasma 12. The ion accelerating electrode 11 extracts argon ion from the plasma 12, irradiates the ion beams 6 to the assemblies 100. Atoms or molecules on the surface 3 of the overcoat 2 or the surface 1a of the base material 1 are shed due to the impact of the ion particles. Thereby, the surface 3 or the overcoat 2 or the surface 1a of the base material 1 can be worked.

In the first embodiment, the largest diameter of the assembly 100 was 15 mm. Seven assemblies 100 were mounted on the stage 10 in the etching chamber 9. The diameter of a bundle of the ion beams 6 from the ion gun 13 was 60 mm. The mask 4 was kept 10 mm away from the surface 3 of the overcoat 2 or the surface 1a of the base material 1. The etching condition was as follows. The pressure of the introduced argon gas was 0.09 Pa, the voltage for accelerating the ion beams 6 was 800 V, the current density of the ion beams 6 was 1.0 mA/cm$^2$, and the time for irradiating the ion beams 6 was three minutes. The total time for forming per die, including the time for assembling the intermediate assembly 100, the time for setting the assemblies 100 in the etching chamber 9 and the time for removing the air from the inside of the etching chamber 9 to form a vacuum, was about ninety minutes. If the diameter of the bundle of the ion beams can be made much larger, many dies can be formed effectively.

Figure 3:
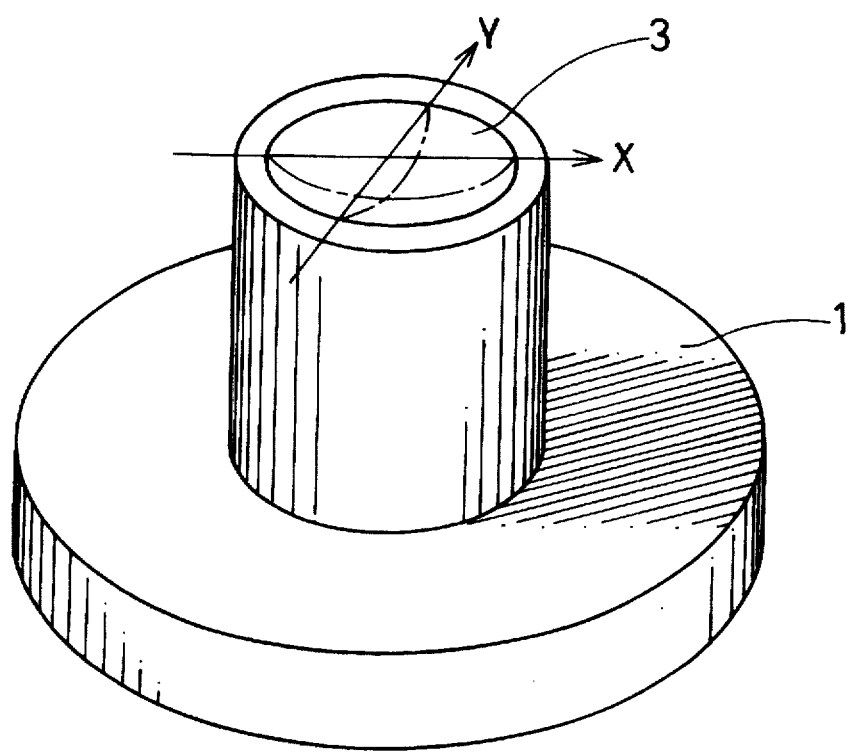
FIG. 3 is a perspective view showing the shape of the die formed in the first embodiment.
Figure 5:
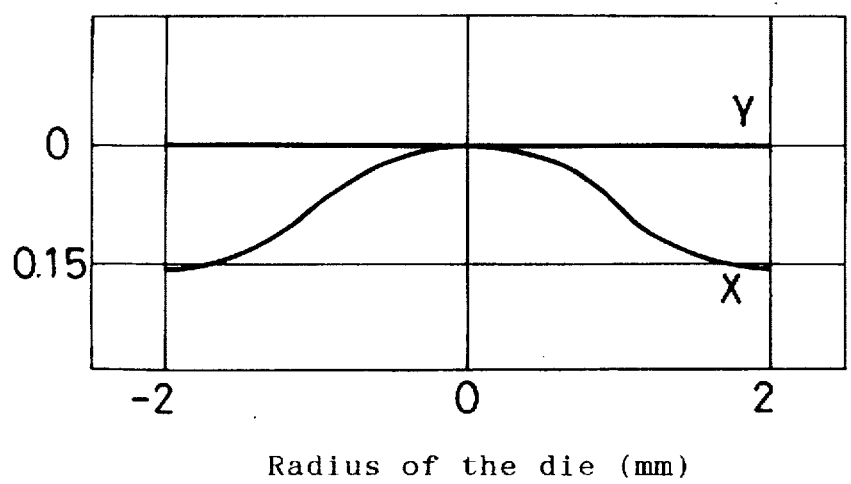
FIG. 5 is a graph showing data corresponding to the cross-sectional shapes of the die along the axes X and Y in FIGS. 2 and 3 in the first embodiment.

The cross-sectional shapes of the die formed by the above-mentioned method were measured along the axes X and Y shown in FIGS. 2 and 3. The results of the measurement are shown in FIG. 5. In FIG. 5, the ordinate represents the distance between the measured position and the center of the die, and the abscissa represents the displacement between the shape of the etched surface and the rotation symmetric shape before the etching process at the measured position, which is defined to be zero at the center of the die. As can be seen from FIG. 5, the cross-sectional shape of the die along the axis Y was not changed from the rotation symmetric shape before the etching process, since the center region of the surface 3 of the overcoat 2 or the surface 1a of the base material 1 along the line Y was covered by the mask 4 and was evenly etched by the argon ion beams 6. On the other hand, the cross-sectional shape of the die along the axis X is gradually inclined from the center to the outer periphery, since the region distant from the center of the die along the axis X was exposed to the ion beams 6 much more than the center region. As a result, the shape of the surface of the die, corresponding to the worked surface 3 of the overcoat 2 or the surface 1a of the base material 1, is rotationally asymmetric, for example a toric surface. The radius of curvature of the die in the direction along the axis X is relatively larger than that in the direction along the axis Y.

Furthermore, another die having a rotationally symmetric surface is previously prepared by the conventional method. As can be seen from FIG. 13, the optical material 60 made of either glass or resin is disposed between the dies 61 and 62. One of the dies 61 and 62 has the rotationally asymmetric surface formed by the above-mentioned etching method and the other die has the rotationally symmetric surface formed by the conventional method. The dies 61 and 62 and the optical material 60 are heated to a predetermined temperature at which at least the surfaces of the optical material 60 are softened. The dies 61 and 62 are pressed at a predetermined pressure so that the shapes of the surfaces of the dies 61 and 62 are transferred to the surfaces of the optical material 60. After that, the dies 61 and 62 and the optical material 60 are cooled, so that the optical element 50, such as an aspherical lens having the rotationally asymmetric optical functional surface 51, is manufactured.

In the first embodiment, the largest displacement in the cross-sectional shape of the die along the line X at the outer periphery was designed to be 0.15 μm. Repeating the above-mentioned etching processes five times, thirty five dies were obtained. The form tolerance of the dies was within ±0.02 μm against the designed displacement of 0.15 μm.

By repeating the press molding processes, a thousand optical elements were manufactured with the same dies. Furthermore, the optical glass SF8 was used as the optical base material. Since the optical element 50, which is manufactured by using the above-mentioned die, has the rotationally asymmetric optical functional surface 51 such as a toric surface, the optical element 50 generates astigmatism. When the optical performance of the optical elements was measured, each optical element generated substantially the same amount of astigmatism in substantially the same direction. The mean value of the astigmatism was about 30 mλ (mλ):1/1000 of a wavelength of an optical source to be used), which was suitable for use as the objective lens of the optical head for the optical disc apparatus. Furthermore, wavefront aberration of the optical element was entirely small. An optical head was assembled with using the optical element, which was mounted in a manner to cancel the off-axis astigmatism thereof in a radial direction of the optical disc with the axial astigmatism due to the rotationally asymmetric surface. The reproducing characteristic of the optical disc by the optical head using the optical element of this embodiment was superior to the reproducing characteristic of a conventional optical head using a conventional rotationally symmetric lens.

By controlling the shape of the openings 5 of the mask 4, the distance between the mask 4 and the surface 3 of the overcoat 2 or the surface 1a of the base material 1, the etching conditions and the etching quantity, a desired rotationally asymmetric shape can be formed on the die. Thereby, the optical element generating the desired astigmatism can be obtained.

In the first embodiment, argon ions were irradiated for etching the base material. However, substantially the same shape can be obtained by a dry etching method using another ion or radical. Furthermore, the overcoat 2 can be formed on the surface 1a of the base material 1 prior to the etching process, and the surface 3 of the overcoat 2 is etched. However, it is possible that the surface 1a of the base material 1 is etched to be rotationally asymmetric prior to forming the overcoat 2 and the overcoat 2 is formed evenly. Furthermore, the etching can be carried out by scanning the ion beams over the surface 1a of the base material 1 or the surface 3 of the overcoat 2 without using the mask.

SECOND EMBODIMENT

Figure 6:
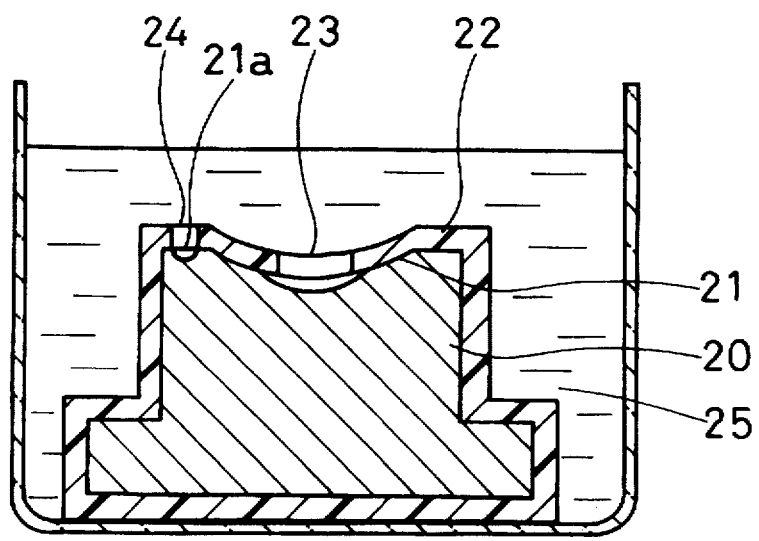
FIG. 6 is a cross-sectional side view showing a method for forming a die that is used in a second embodiment of a method for manufacturing an optical element of this invention.
Figure 7:
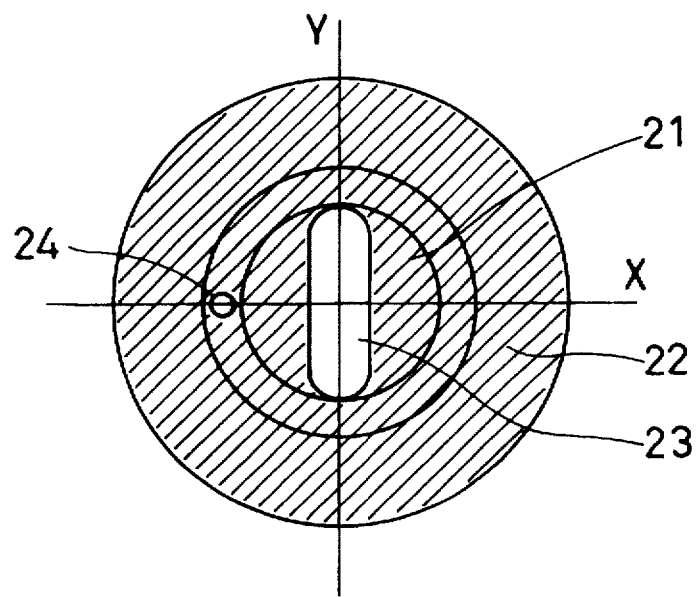
FIG. 7 is a plan view of an intermediate stage of a base material for the die showing the shapes and the relative positions of a mask and the base material for the die in the second embodiment.
Figure 8:
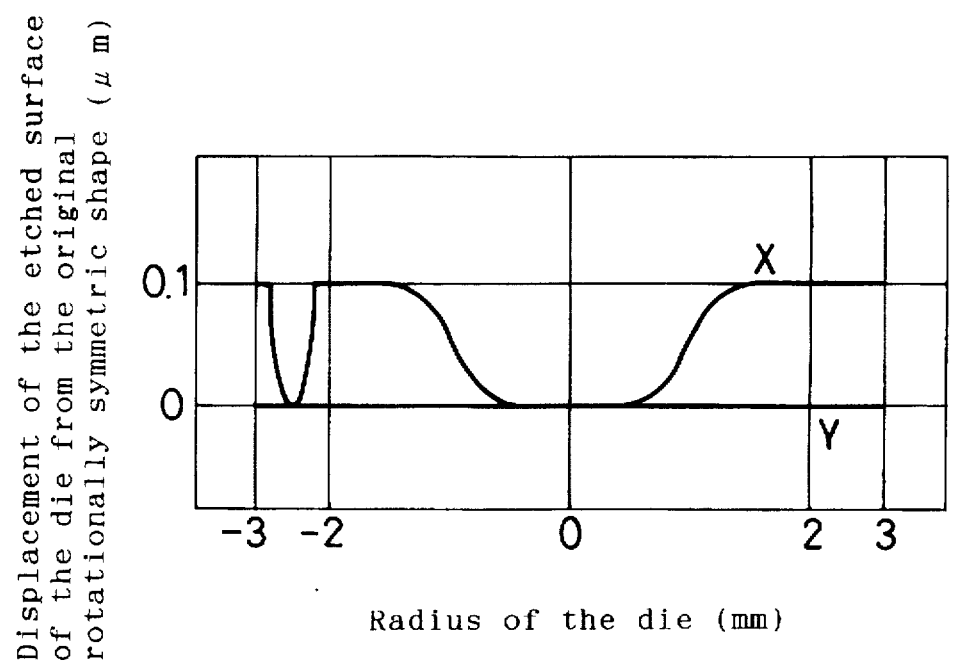
FIG. 8 is a graph showing data corresponding to the cross-sectional shapes of the die along the axes X and Y in FIG. 7 in the second embodiment.

A second embodiment of a method for manufacturing an optical element of this invention is described referring to FIGS. 6 to 8. In the second embodiment, the optical element to be manufactured and the process for manufacturing the optical element by using the dies are substantially the same as those in the first embodiment. However, the method for forming the die having the rotationally asymmetric aspherical surface in the second embodiment is different from that in the first embodiment.

As can be seen from FIG. 6, the whole surface or a base material 20 for the die is covered by a resist mask 22 except for openings 23 and 24. The opening 23 is formed for facing a surface 21 of the base material 20. The opening 24 for forming a mark is provided for facing an edge part 21a of the surface 21. The base material 20 with the resist mask 22 is steeped in an etchant 25. Thus, the surface 21 of the base material 20 is etched to form a rotationally asymmetric shape. The base material 20 is made of a chromium stainless tool steel.

A rotationally symmetric aspherical shape is roughly formed on the surface 21 of the base material 20 by the conventional method. Electroless nickel plating (not shown in the figure) was provided on at least the surface 21 of the base material 20. Furthermore, the nickel plating film on the surface 21 of the base material 20 was cut by a diamond tool of an ultraprecise lathe. Thus, the nickel plating film on the surface 21 of the base material 20 was finished to have a rotationally symmetric aspherical shape corresponding to the cross-sectional shape of the optical element 50 along, for example, the ridge line 52 shown in FIG. 12, precisely. As the etchant 25, dilute of sulfuric acid, using four parts water to one part sulfic acid, was used.

For example, the radius of the surface 21 was 2 mm, and the width of the flat edge part 21a disposed outward of the surface 21 was 1 mm. Thus, the total radius of the molding surface the base material 20 including the edge part was 3 mm. The whole surface of the base material 20 except the openings 23 and 24 was covered by the resist mask 22 in order not to be etched by the etchant 25. The opening 23 was disposed along an axis Y shown in FIG. 7. The width of the opening 23 was 1 mm, and the length of the opening 23 was about 4 mm. The opening 24 was disposed on an axis X which crosses the axis Y at right angles. The diameter of the opening 24 was 0.6 mm.

The etchant 25 was filled in a glass vessel having a diameter of about 200 mm. The temperature of the etchant 25 was maintained at 40 degrees Celsius. Forty of the masked base materials 20, which have the largest diameter of 16 mm and were arranged on a resin basket, were steeped in the etchant 25 for five minutes. After that, the basket was pulled up from the etchant 25, and washed with pure water. As a result, the nickel plating film on the surface 21 of the base material 20 was etched to form a rotationally asymmetric shape.

The cross-sectional shapes of the die formed by the above-mentioned method were measured along the axes X and Y shown in FIG. 7. The results of the measurement are shown in FIG. 8. In FIG. 8, the ordinate represents the distance between the measured position and the center of the die, and the abscissa represents the displacement between the shape of the etched surface and the rotation symmetric shape before the etching process at the measured position, which is defined to be zero at the center of the die. As can be seen from FIG. 8, the cross-sectional shape of the die along the axis Y was not changed from the rotation symmetric shape before the etching process, since the center region of the surface 21 of the base material 20 along the line Y was not covered by the mask 22 and was evenly etched by the etchant 25. On the other hand, in the cross-sectional shape of the die along the axis X, the peripheral region is relatively higher by about 0.1 μm versus the center region of the die, since the outer peripheral region of the surface 21 along the axis X was covered by the resist mask 22 and the region in the vicinity of the center of the die is etched by the etchant much more than the peripheral region. Furthermore, a hollow was formed at a position facing the opening 24 between the radius of −2 to −3 in FIG. 8. As a result, the shape of the surface of the die has a rotationally asymmetric shape such as a toric shape. The radius of curvature of the die in the direction along the axis X was relatively smaller than that in the direction along the axis Y.

When the shapes of the formed forty dies formed by the above-mentioned method were measured, the form tolerance of the dies in the cross-sectional shape of the die along the line X was within −0.02 μm to +0.03 μm against the mean displacement value of 0.1 μm.

For preventing the flawing on the surface of the die or adhesion of the melted optical material during the molding process, an overcoat such as platinum - tantalum (Pt-Ta) alloy film having a thickness of 2 μm is formed on the formed rotationally asymmetric surface of the die by a sputtering method.

Furthermore, other dies having rotationally symmetric aspherical surface were prepared. Similar to the above-mentioned first embodiment shown in FIG. 13, an optical material 60 made of polycarbonate resin was placed between the dies 61 and 62. One of the dies 61 and 62 has the rotationally asymmetric surface formed by the above-mentioned etching method and the other die has the rotationally symmetric surface formed by the conventional method. After heating the optical material 60 and the dies 61 and 62 to a predetermined temperature, the dies 61 and 62 were pressed by a predetermined pressure. After that, the optical material 60 and the dies 61 and 62 were cooled. Thus, the optical element 50 was obtained.

Figure 13:
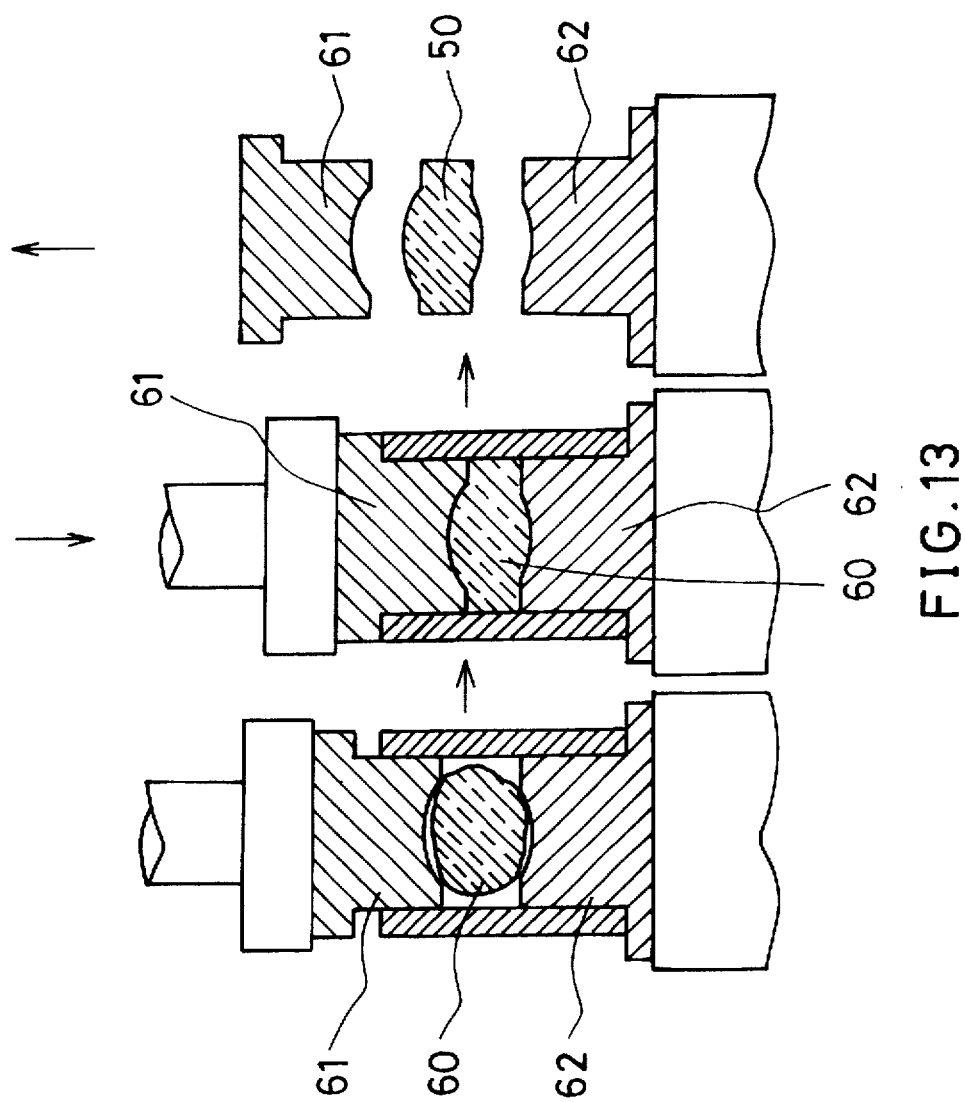
FIG. 13 is a cross-sectional side view showing a press molding process of the method for manufacturing the optical element of this invention.

By repeating such press molding processes, a thousand optical elements were manufactured with the same dies. The optical element, which is manufactured by the press molding process using the above-mentioned die as shown in FIG. 13, has the rotationally asymmetric optical functional surface such as toric surface, so that the optical element generates astigmatism. When the optical performance of the optical elements were measured, each optical element generated substantially the same amount of the astigmatism in substantially the same direction. The mean value of the astigmatism was about 25 m$\lambda$ (m$\lambda$: 1/1000 of a wavelength of an optical source to be used), which was suitable for use as an objective lens of an optical head for optical disc apparatus. Furthermore, wavefront aberration of the optical element was small. An optical head was assembled using the optical element which was mounted by detecting the mark, shown in FIGS. 7 and 8, which shows the direction of the rotational asymmetry. In the second embodiment, since the astigmatism need not actually be detected, the optical element can be mounted in the direction having the best optical performance easily, when the optical element is mounted on the optical head. The reproducing characteristic of the optical disc by the optical head using the optical element of this embodiment was superior to the reproducing characteristic of a conventional optical head using the conventional rotationally symmetric lens.

By controlling the shape of the openings 23 of the resist mask 22, etching conditions and etching quantity, a desired rotationally asymmetric shape can be formed on the die. Thereby, the optical element, which generates the desired astigmatism, can be obtained. Furthermore, the etching process is not limited to the above-mentioned case shown in FIG. 6. Only a part of the base material 20 including the surface 21 can be steeped in the etchant 25. In the latter case, it is possible to mask only a part in the vicinity of the surface 21 of the base material 20. The components of the etchant 25 are not restricted as long as the material of the base material 20 can be etched.

In the second embodiment, sulfuric acid was used for etching the base material. However, the etchant is not restricted to sulfuric acid. Another acid, which can etch the base material, can be used as the etchant. Furthermore, in the second embodiment, the nickel plating film on the surface 21 of the base material is etched. Alternatively, the surface 21 of the base material 20 can be etched directly by the etchant.

THIRD EMBODIMENT

Figure 9:
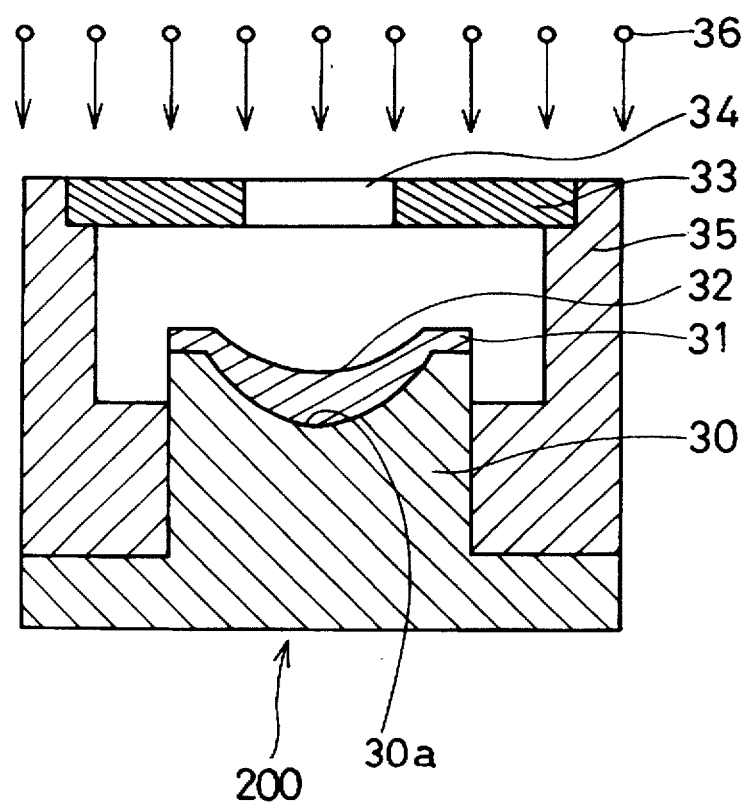
FIG. 9 is a cross-sectional side view showing an intermediate assembly and a method for forming a die that are used in a third embodiment of a method for manufacturing an optical element of this invention.
Figure 10:
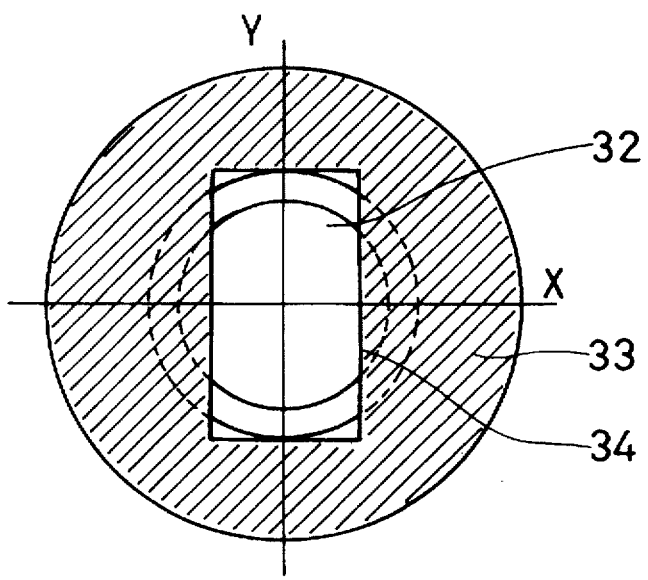
FIG. 10 is a plan view of the intermediate assembly shown in FIG. 9 showing the shapes and the relative positions of a mask and a base material for the die in the third embodiment.
Figure 11:
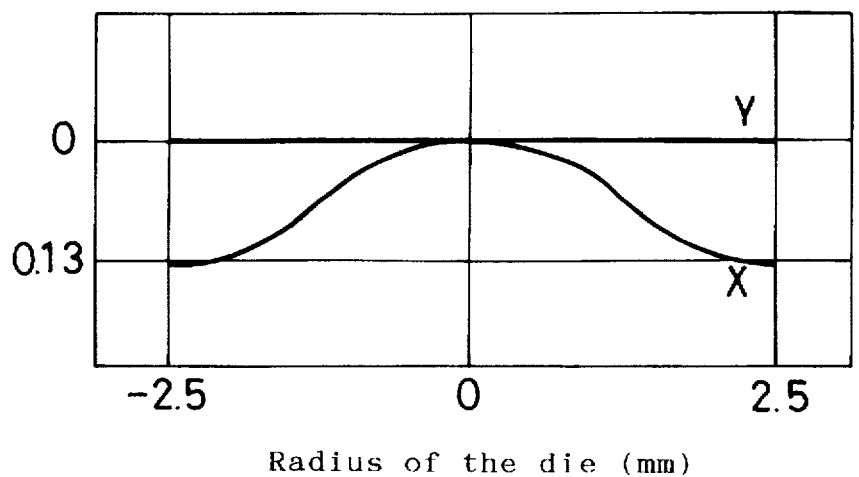
FIG. 11 is a graph showing data corresponding to the cross-sectional shapes of the die along the axes X and Y in FIG. 10 in the third embodiment.

A third embodiment of a method for manufacturing an optical element of this invention is described referring to FIGS. 9 to 11. In the third embodiment, the optical element to be manufactured and the process for manufacturing the optical element by using the dies are substantially the same as those in the first embodiment. However, the method for forming the die having the rotationally asymmetric aspherical surface in the third embodiment is different from that in the first embodiment. In the third embodiment, a sputtering method is used for forming the rotationally asymmetric aspherical surface.

As shown in FIG. 9, an intermediate assembly 200 is comprised of a base material 30 for the die, a mask 33 and a mask holder 35. The mask 33 is disposed above the base material 30. Sputtering particles 36 pass from above to below the mask 33. Thus, a film 31 will be formed on a surface 30a of the base material 30 by accumulation of the sputtering particles 36. The base material 30 is made of cermet including alumina as a main component.

Prior to the sputtering process, a rotationally symmetric aspherical shape is formed on a surface 30a of the base material 30 by the conventional method. The base material 30 is rotated around an axis which corresponds to the optical axis of the optical element, such as a rotationally asymmetric aspherical lens, to be manufactured. A grinding tool is fed in a manner so that the working point, at which the grinding tool and the base material contact, follows a non-circular arc of a cross-sectional shape of the optical element 50 in a predetermined direction, for example, along the ridge line 52 shown in FIG. 12.

As can be seen from FIG. 10, the crosshatched region of the mask 33 covers the base material 30. For example, the diameter of the surface 30a of the base material 30 was 6 mm. The size of rectangular opening 34 was 6 mm ×4 mm. The distance between the mask 33 and the surface 30a of the base material 30 was 5 mm.

Next, fourteen of the above-mentioned intermediate assemblies 200 were arranged on a holder having a diameter of about 100 mm in a sputtering apparatus. Air in the inside of the sputtering apparatus was removed to form a vacuum. After that, argon (Ar) gas was introduced into the sputtering apparatus. The pressure of the argon gas was 0.13 Pa. An electric discharge was generated at a power of 100 W. Sputtering continued for sixty minutes. Thus, the film 31, having an uneven thickness, is formed on the surface 30a of the base material 30 so as to be rotationally asymmetric. In the third embodiment, a material of the film 31 was platinum-rhenium (Pt-Re) alloy formed by the sputtering method. The film 31 serves as an overcoat for preventing the flawing on the surface of the die or adhesion of the melted optical material during the molding process. The thickness of the film 31 at the center of the die was 2 µm. The thickness of the film 31 at a position distant 2.5 mm from the center in the direction along the axis X was 1.87 µm. The displacement in the cross-sectional shape of the die along the axis X from the original rotationally symmetric shape was 0.13 µm. By repeating the same sputtering processes three times, forty two dies were obtained. The form tolerance of the dies was within ±0.02 µm against the mean displacement of 0.13 µm.

The cross-sectional shapes of the die formed by the above-mentioned method were measured along the axes X and Y shown in FIG. 10. The results of the measurement are shown in FIG. 11. In FIG. 11, the ordinate represents the distance between the measured position and the center of the die, and the abscissa represents the displacement between the surface 32 of the film 31 and the original rotationally symmetric shape formed on the surface 30a of the base material 30 at the measured position, which is defined to be zero at the center of the die. As can be seen from FIG. 11, the cross-sectional shape of the die along the axis Y was not changed from the original shape of the surface 30a of the base material 30, since the center region of the surface 30a of the base material 30 was not covered by the mask 33 and the film 31 was evenly formed thereon. On the other hand, the cross-sectional shape of the die along the axis X becomes gradually inclined from the center to the outer periphery, since the region in the vicinity of the outer periphery of the base material 30 was covered by the mask 33 and the amount of the particles adhered in the region in the vicinity of the center of the surface 30a of the base material 30 was larger than that in the region of the outer periphery of the surface 30a. As a result, the shape of the surface of the die corresponding to the surface 32 of the film 31 on the base material 30 was rotationally asymmetric, such as a toric shape. The radius of curvature of the die in the direction along the axis X was relatively larger than that in the direction along the axis Y.

Furthermore, other dies having a rotationally symmetric aspherical surface were prepared. Similar to the above-mentioned first embodiment shown in FIG. 13, an optical material 60 made of optical glass VC79 was placed between the dies 61 and 62. One of the dies 61 and 62 has the rotationally asymmetric surface formed by the above-mentioned sputtering method and the other die has the rotationally symmetric surface formed by the conventional method. After heating the optical material 60 and the dies 61 and 62 to a predetermined temperature, the dies 61 and 62 were pressed by a predetermined pressure. After that, the optical material 60 and the dies 61 and 62 were cooled. Thus, the optical element 50 was obtained.

By repeating such press molding processes, a thousand optical elements were manufactured with the same dies. The optical element, which is manufactured using the above-mentioned die, has a rotationally asymmetric optical functional surface, such as a toric surface, so that the optical element generates astigmatism. When the optical performance of the optical elements was measured, each optical element generated substantially the same amount of astigmatism in substantially the same direction. The mean value of the astigmatism was about 25 m λ (mλ: 1/1000 of a wavelength of an optical source to be used), which was suitable for use as an objective lens of an optical head for optical disc apparatus. Furthermore, wavefront aberration of the optical element was small. An optical head was assembled using the optical element which was mounted in a manner to cancel the off-axis astigmatism thereof in the radial direction of the photo-magnetic disc by the axial astigmatism due to the rotationally asymmetric surface. The reproducing characteristic of the photo-magnetic disc by the optical head using the optical element of this embodiment was superior to the reproducing characteristic of a conventional optical head using the conventional rotationally symmetric lens.

By controlling the shape of the openings 34 of the mask 33, distance between the mask 33 and the surface 30a of the base material 30, sputtering conditions and quantity of the particles to be adhered on the surface 30a of the base material 30, a desired rotationally asymmetric shape can be formed on the die. Thereby, the optical element, which generates the desired astigmatism, can be obtained.

In the third embodiment, sputtering was used as a method for forming the film 31. However, PVD (physical vapor deposition) method such as ion plating or CVD (chemical vapor deposition) method can be used for forming the film 31. Furthermore, the film 31 was formed in the rotationally asymmetric shape. However, it is possible that an intermediate layer is formed to be rotationally asymmetric and an overcoat is evenly formed on the intermediate layer.

In the above-mentioned first, second and third embodiments, the base materials 1, 20 and 30 have rotationally symmetric shapes as shown in the plan views of FIGS. 2, 7 and 10. However, the shape of the base material is not restricted to be rotationally symmetrical. For example, when the surface, to which the optical functional surface is formed, is rotationally symmetric, the shape of other parts of the base material can be rotationally asymmetric such as rectangular cross-section.

Furthermore, in the above-mentioned embodiments, the shape of the surfaces 1a, 21 and 30a of the die are respectively symmetric about the axis Y. However, this invention can be applied to form an optical functional surface which is asymmetrical about the axis. The configuration of the masks 4 and 33 and the mask holder 7 and 35 are not restricted by the above-mentioned embodiments shown in the figure. As long as the mask can shield the etching particles or sputtering particles, it can be used in this invention.

The invention may be embodied in other specific forms without departing from the spirit and scope thereof. The embodiments are to be considered in all respects as illustrative and not restrictive. The scope of the invention is indicated by the appended claims rather than by the foregoing description, and all changes which come within the meaning and range of equivalency of the claims are intended to be embraced therein.

What is claimed is:

1. A method for manufacturing an optical element comprising the steps of disposing an optical material between a pair of dies, heating said optical material and said dies at a predetermined temperature and pressing said dies for transferring shapes of surfaces of said dies to surfaces of said optical material, wherein at least one of the surfaces of said dies has a rotationally asymmetric shape, and said rotationally asymmetric shape is formed by etching a rotationally symmetric surface of a base material for said die, unevenly.

2. The method for manufacturing an optical element according to claim 1, wherein said rotationally asymmetric shape of said surface of said die is a toric surface or a cylindrical surface.

3. The method for manufacturing an optical element according to claim 1, wherein said rotationally asymmetric shape is configured in a manner to generate astigmatism of axial wavefront aberration when said rotationally asymmetric shape is transferred to an optical element.

4. The method for manufacturing an optical element according to claim 1, wherein an overcoat is evenly formed on said rotationally asymmetric surface of said die.

5. The method for manufacturing an optical element according to claim 1, wherein said rotationally asymmetric shape of said die is formed by a dry etching process which has steps of disposing a mask on or above said rotationally symmetric surface of said base material and irradiating ion beams or radical beams on said rotationally symmetric surface of said base material.

6. The method for manufacturing an optical element according to claim 5, wherein said rotationally asymmetric shape of said surface of said die is a toric surface or a cylindrical surface.

7. The method for manufacturing an optical element according to claim 5, wherein said rotationally asymmetric shape is configured in a manner to generate astigmatism of axial wavefront aberration when said rotationally asymmetric shape is transferred to an optical element.

8. The method for manufacturing an optical element according to claim 5, wherein an overcoat is evenly formed on said rotationally asymmetric surface of said die.

9. The method for manufacturing an optical element according to claim 1, wherein said rotationally asymmetric shape of said die is formed by a wet etching process which has steps of forming a resist film on at least said rotationally symmetric surface of said base material except a predetermined shaped portion to be etched, and steeping at least said rotationally symmetric surface of said base material in an etchant.

10. The method for manufacturing an optical element according to claim 9, wherein said rotationally asymmetric shape of said surface of said die is a toric surface or a cylindrical surface.

11. The method for manufacturing an optical element according to claim 9, wherein said rotationally asymmetric shape is designed in a manner to generate astigmatism of axial wavefront aberration when said rotationally asymmetric shape is transferred to an optical element.

12. The method for manufacturing an optical element according to claim 9, wherein an overcoat is evenly formed on said rotationally asymmetric surface of said die.

13. A method for manufacturing an optical element comprising the steps of disposing an optical material between a pair of dies, heating said optical material and said dies at a predetermined temperature and pressing said dies for transferring shapes of surfaces of said dies to surfaces of said optical material, wherein at least one of the surfaces of said dies has a rotationally asymmetric shape; said rotationally asymmetric shape is formed by etching a rotationally symmetric surface of an overcoat, unevenly; and said overcoat is formed on a rotationally symmetric surface of a base material for said die, evenly.

14. The method for manufacturing an optical element according to claim 13, wherein said rotationally asymmetric shape of surface of said die is a toric surface or a cylindrical surface.

15. The method for manufacturing an optical element according to claim 13, wherein said rotationally asymmetric shape is configured in a manner to generate astigmatism of axial wavefront aberration when said rotationally asymmetric shape is transferred to an optical element.

16. The method for manufacturing an optical element according to claim 13, wherein said rotationally asymmetric shape of said die is formed by a dry etching process which has steps of disposing a mask on or above said rotationally symmetric surface of said overcoat and irradiating ion beams or radical beams on said rotationally symmetric surface of said overcoat.

17. The method for manufacturing an optical element according to claim 16, wherein said rotationally asymmetric shape of said surface of said die is a toric surface or a cylindrical surface.

18. The method for manufacturing an optical element according to claim 16, wherein said rotationally asymmetric shape is configured in a manner to generate astigmatism of axial wavefront aberration when said rotationally asymmetric shape is transferred to an optical element.

19. The method for manufacturing an optical element according to claim 13, wherein said rotationally asymmetric shape of said die is formed by a wet etching process which has steps of forming a resist film on at least said rotationally symmetric surface of said overcoat except a predetermined shaped portion to be etched, and steeping at least said rotationally symmetric surface of said overcoat on said base material in an etchant.

20. The method for manufacturing an optical element according to claim 19, wherein said rotationally asymmetric shape of said surface of said die is a toric surface or a cylindrical surface.

21. The method for manufacturing an optical element according to claim 19, wherein said rotationally asymmetric shape is configured in a manner to generate astigmatism of axial wavefront aberration when said rotationally asymmetric shape is transferred to an optical element.

22. A method for manufacturing an optical element comprising the steps of disposing an optical material between a pair of dies, heating said optical material and said dies at a predetermined temperature and pressing said dies for transferring shapes of surfaces of said dies to surfaces of said optical material, wherein at least one of the surfaces of said die has a rotationally asymmetric shape, and said rotationally asymmetric shape is formed by accumulating a film on a rotationally symmetric surface of a base material for said die, unevenly.

23. The method for manufacturing an optical element according to claim 22, wherein said rotationally asymmetric shape of said die is formed by a method selected from a sputtering method, a physical vapor deposition (PVD) method and a chemical vapor deposition (CVD) method, which has steps of disposing a mask on or above said rotationally symmetric surface of said base material and irradiating sputtering particles on said rotationally symmetric surface of said base material.

24. The method for manufacturing an optical element according to claim 22, wherein said rotationally asymmetric shape of said surface of said die is a toric surface or a cylindrical surface.

25. The method for manufacturing an optical element according to claim 22, wherein said rotationally asymmetric shape is configured in a manner to generate astigmatism of axial wavefront aberration when said rotationally asymmetric shape is transferred to an optical element.

26. A method for forming a rotationally asymmetric die useful for molding an optical element comprising the steps of disposing a mask on or above a rotationally symmetric surface of a base material and irradiating ion beams or radical beams on said rotationally symmetric surface of said base material for etching said rotationally symmetric surface of said base material, unevenly.

27. The method for forming a rotationally asymmetric die useful for molding an optical element according to claim 26, wherein said rotationally asymmetric shape of the optical functional surface of said die is a toric surface or a cylindrical surface.

28. The method for forming a rotationally asymmetric die useful for molding an optical element according to claim 26, wherein said rotationally asymmetric shape is configured in a manner to generate astigmatism of axial wavefront aberration when said rotationally asymmetric shape is transferred to an optical element.

29. The method for forming a rotationally asymmetric die useful for molding an optical element according to claim 26, wherein an overcoat is evenly formed on said rotationally asymmetric surface of said die.

30. A method for forming a rotationally asymmetric die useful for molding an optical element comprising the steps of forming a resist film on a rotationally symmetric surface of a base material except a predetermined shaped portion to be etched, and steeping at least said rotationally symmetric surface of said base material in an etchant for etching said rotationally symmetric surface of said base material, unevenly.

31. The method for forming a rotationally asymmetric die useful for molding an optical element according to claim 30, wherein said rotationally asymmetric shape of the optical functional surface of said die is a toric surface or a cylindrical surface.

32. The method for forming a rotationally asymmetric die useful for molding an optical element according to claim 30, wherein said rotationally asymmetric shape is configured in a manner to generate astigmatism of axial wavefront aberration when said rotationally asymmetric shape is transferred to an optical element.

33. The method for forming a rotationally asymmetric die useful for molding an optical element according to claim 30, wherein an overcoat is evenly formed on said rotationally asymmetric surface of said die.

34. A method for forming a rotationally asymmetric die useful for molding an optical element comprising the steps of disposing a mask on or above a rotationally symmetric surface of an overcoat on a base material and irradiating ion beams or radical beams on said rotationally symmetric surface of said overcoat for etching said rotationally symmetric surface of said overcoat, unevenly.

35. The method for forming a rotationally asymmetric die useful for molding an optical element according to claim 34, wherein said rotationally asymmetric shape of the optical functional surface of said die is a toric surface or a cylindrical surface.

36. The method for forming a rotationally asymmetric die useful for molding an optical element according to claim 34, wherein said rotationally asymmetric shape is configured in a manner to generate astigmatism of axial wavefront aberration when said rotationally asymmetric shape is transferred to an optical element.

37. A method for forming a rotationally asymmetric die useful for molding an optical element comprising the steps of forming a resist film on a rotationally symmetric surface of an overcoat on a base material except a predetermined shaped portion to be etched, and steeping at least said rotationally symmetric surface of said overcoat on said base material in an etchant for etching said rotationally symmetric surface of said overcoat, unevenly.

38. The method for forming a rotationally asymmetric die useful for molding an optical element according to claim 37, wherein said rotationally asymmetric shape of the optical functional surface of said die is a toric surface or a cylindrical surface.

39. The method for forming a rotationally asymmetric die useful for molding an optical element according to claim 37, wherein said rotationally asymmetric shape is configured in a manner to generate astigmatism of axial wavefront aberration when said rotationally asymmetric shape is transferred to an optical element.

40. A method for forming a rotationally asymmetric die useful for molding an optical element comprising the steps of accumulating a film on a rotationally symmetric surface of a base material for said die, unevenly.

41. The method for forming a rotationally asymmetric die useful for molding an optical element according to claim 40, wherein said rotationally asymmetric shape of said die is formed by a method selected from a sputtering method, a physical vapor deposition (PVD) method and a chemical vapor deposition (CVD) method, which has steps of disposing a mask on or above said rotationally symmetric surface of said base material and irradiating sputtering particles on said rotationally symmetric surface of said base material.

42. The method for forming a rotationally asymmetric die useful for molding an optical element according to claim 40 wherein said rotationally asymmetric shape of said optical functional surface of said die is a toric surface or a cylindrical surface.

43. The method for forming a rotationally asymmetric die useful for molding an optical element according to claim 40, wherein said rotationally asymmetric shape is configured in a manner to generate astigmatism of axial wavefront aberration when said rotationally asymmetric shape is transferred to an optical element.

* * * * *